United States Patent
Chen et al.

(10) Patent No.: US 9,230,467 B2
(45) Date of Patent: Jan. 5, 2016

(54) DISPLAY MODULE AND ASSEMBLY METHOD THEREOF

(75) Inventors: Janglin Chen, Kaohsiung County (TW); Tzeng-Shii Tsai, Hsinchu County (TW); Hwa-Nien Yu, Yorktown Heights, NY (US)

(73) Assignee: Industrial Technology Research Institute, Hsinchu (TW)

( * ) Notice: Subject to any disclaimer, the term of this patent is extended or adjusted under 35 U.S.C. 154(b) by 690 days.

(21) Appl. No.: 13/105,896

(22) Filed: May 12, 2011

(65) Prior Publication Data
US 2012/0056859 A1 Mar. 8, 2012

(30) Foreign Application Priority Data

Sep. 7, 2010 (TW) ................................ 99130232 A

(51) Int. Cl.
*G02F 1/1345* (2006.01)
*G09G 3/20* (2006.01)
*H05K 1/02* (2006.01)
(Continued)

(52) U.S. Cl.
CPC .................. *G09G 3/20* (2013.01); *H05K 1/028* (2013.01); *G02F 1/1345* (2013.01); *G02F 1/133305* (2013.01); *G09G 2300/0426* (2013.01); *G09G 2310/0281* (2013.01); *H05K 1/189* (2013.01); *H05K 2201/053* (2013.01);
(Continued)

(58) Field of Classification Search
CPC ... G02F 1/133305; G02F 1/1345; G09G 3/20; G09G 2300/0426; G09G 2310/0281; H05K 1/028; H05K 1/189; H05K 2201/053; H05K 2201/055; H05K 2201/10128; H05K 2203/0228

USPC .................................................. 349/149–152
See application file for complete search history.

(56) References Cited

U.S. PATENT DOCUMENTS 4,597,635 A 7/1986 Hoshikawa
5,745,340 A 4/1998 Landau
(Continued)

FOREIGN PATENT DOCUMENTS

CN 1393007 1/2003
CN 101576696 11/2009
(Continued)

OTHER PUBLICATIONS

Chan et al., "Electrical Characterization of NCP- and NCF-Bonded Fine-Pitch Flip-Chip-on-Flexible Packages", IEEE Transactions on Advanced Packaging, Feb. 2007, pp. 142-147, vol. 30, No. 1.
(Continued)

*Primary Examiner* — Edward Glick
*Assistant Examiner* — David Chung
(74) *Attorney, Agent, or Firm* — Jianq Chyun IP Office

(57) ABSTRACT

A display module and an assembly method thereof are provided. The display module includes a display region, at least one connection terminal, and a plurality of connective lines. The display region, the connection terminal, and the connective lines are disposed on a same flexible substrate. A plurality of pixels is arranged within the display region. The connection terminal is arranged at an extension portion of a non-display region of the flexible substrate. The connective lines respectively connect the pixels in the display region to the connection terminal at the extension portion. The connection terminal is connected to an external circuit for receiving signals and transmitting the same to the display region.

15 Claims, 14 Drawing Sheets

(51) Int. Cl.
*H05K 1/18* (2006.01)
*G02F 1/1333* (2006.01)

(52) U.S. Cl.
CPC .......... *H05K 2201/055* (2013.01); *H05K 2201/10128* (2013.01); *H05K 2203/0228* (2013.01)

(56) References Cited

U.S. PATENT DOCUMENTS

| | | | |
|---|---|---|---|
| 5,805,415 A | 9/1998 | Tran et al. | |
| 6,028,764 A | 2/2000 | Richardson et al. | |
| 6,388,339 B1 * | 5/2002 | Yamamoto et al. | 257/787 |
| 6,535,262 B2 * | 3/2003 | Houdeau | 349/150 |
| 6,583,844 B1 * | 6/2003 | Mishima et al. | 349/149 |
| 6,636,204 B2 | 10/2003 | Santoh | |
| 6,774,973 B2 * | 8/2004 | Ko | 349/153 |
| 6,922,226 B2 * | 7/2005 | Park et al. | 349/149 |
| 7,394,195 B2 | 7/2008 | Kato | |
| 7,439,540 B2 | 10/2008 | Chang et al. | |
| 7,471,506 B2 | 12/2008 | Yin | |
| 7,505,107 B2 * | 3/2009 | Takaishi | 349/149 |
| 8,379,003 B2 * | 2/2013 | Kawaguchi et al. | 345/205 |
| 2004/0239586 A1 | 12/2004 | Cok | |
| 2005/0280618 A1 | 12/2005 | Sato et al. | |
| 2006/0250083 A1 | 11/2006 | Oh et al. | |
| 2007/0058124 A1 | 3/2007 | Chen | |
| 2008/0100789 A1 * | 5/2008 | Kamiya | 349/149 |
| 2008/0242181 A1 | 10/2008 | Takahashi | |
| 2008/0277375 A1 | 11/2008 | Paek et al. | |
| 2009/0033644 A1 | 2/2009 | Kawaguchi et al. | |
| 2009/0256991 A1 * | 10/2009 | Shinn et al. | 349/60 |

FOREIGN PATENT DOCUMENTS

| | | |
|---|---|---|
| JP | 2008-242249 | 10/2008 |
| TW | 200704268 | 1/2007 |
| TW | 200834490 | 8/2008 |
| TW | 200912434 | 3/2009 |
| WO | 2006036450 | 4/2006 |
| WO | 2007064115 | 6/2007 |
| WO | 2007127191 | 11/2007 |

OTHER PUBLICATIONS

Govaerts et al., "Interconnecting drivers to flexible displays", Journal of the Society for Information Display, Jul. 2008, pp. 765-775, vol. 6, Issue 7.

McAlpine et al., "High-Performance Nanowire Electronics and Photonics on Glass and Plastic Substrates", Nano Letters, 2003, pp. 1531-1535, vol. 3, No. 11.

Hirakawa et al., "A light and flexible plasma tube array with a film substrate", Journal of the Society for Information Display, Aug. 2005, pp. 647-655, vol. 13, Issue 8.

"First Office Action of China Counterpart Application", issued on Jan. 31, 2013, p. 1-p. 6, in which the listed references were cited.

"Office Action of Taiwan Counterpart Application", issued on Jul. 3, 2014, p. 1-p. 9, in which the listed reference was cited.

"Office Action of Taiwan Counterpart Application", issued on Jan. 3, 2014, p. 1-p. 10, in which the listed references were cited.

* cited by examiner

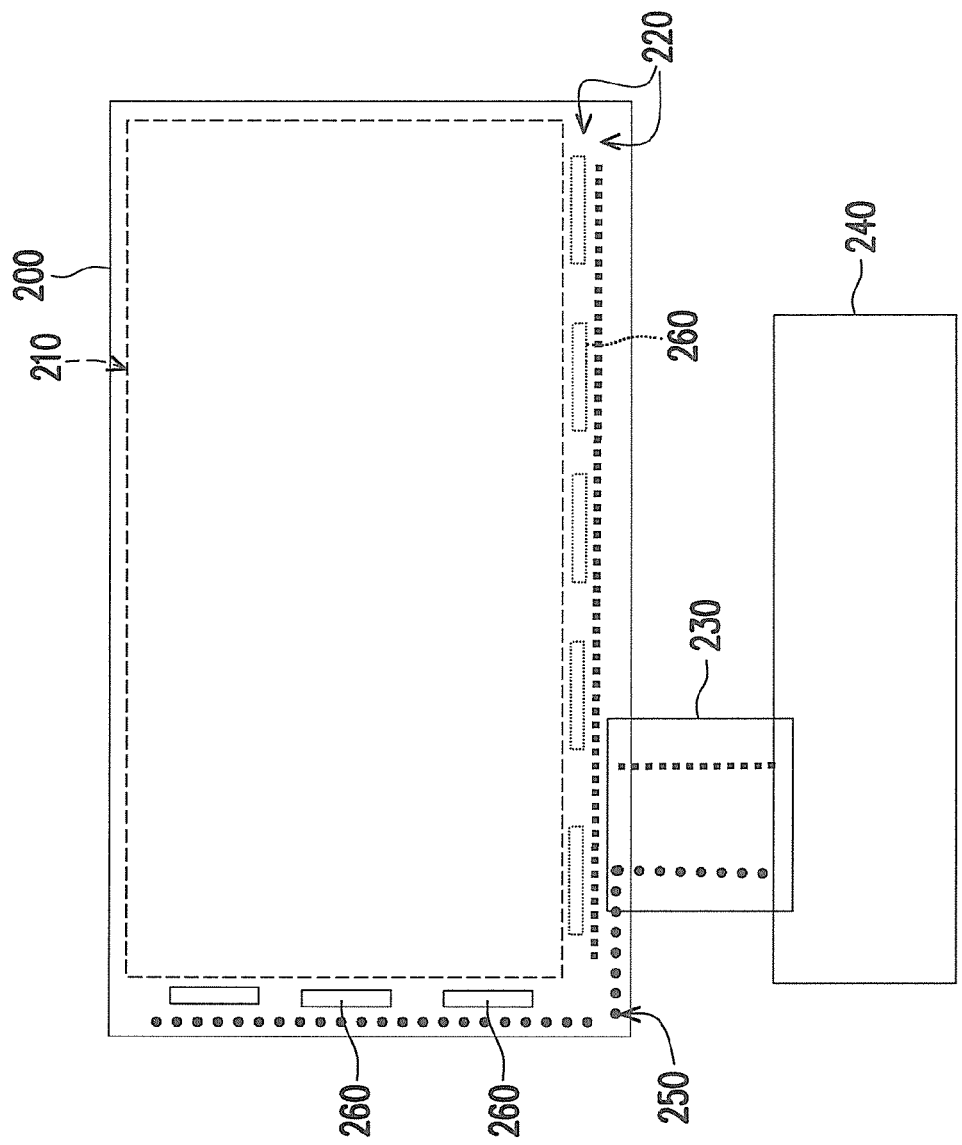

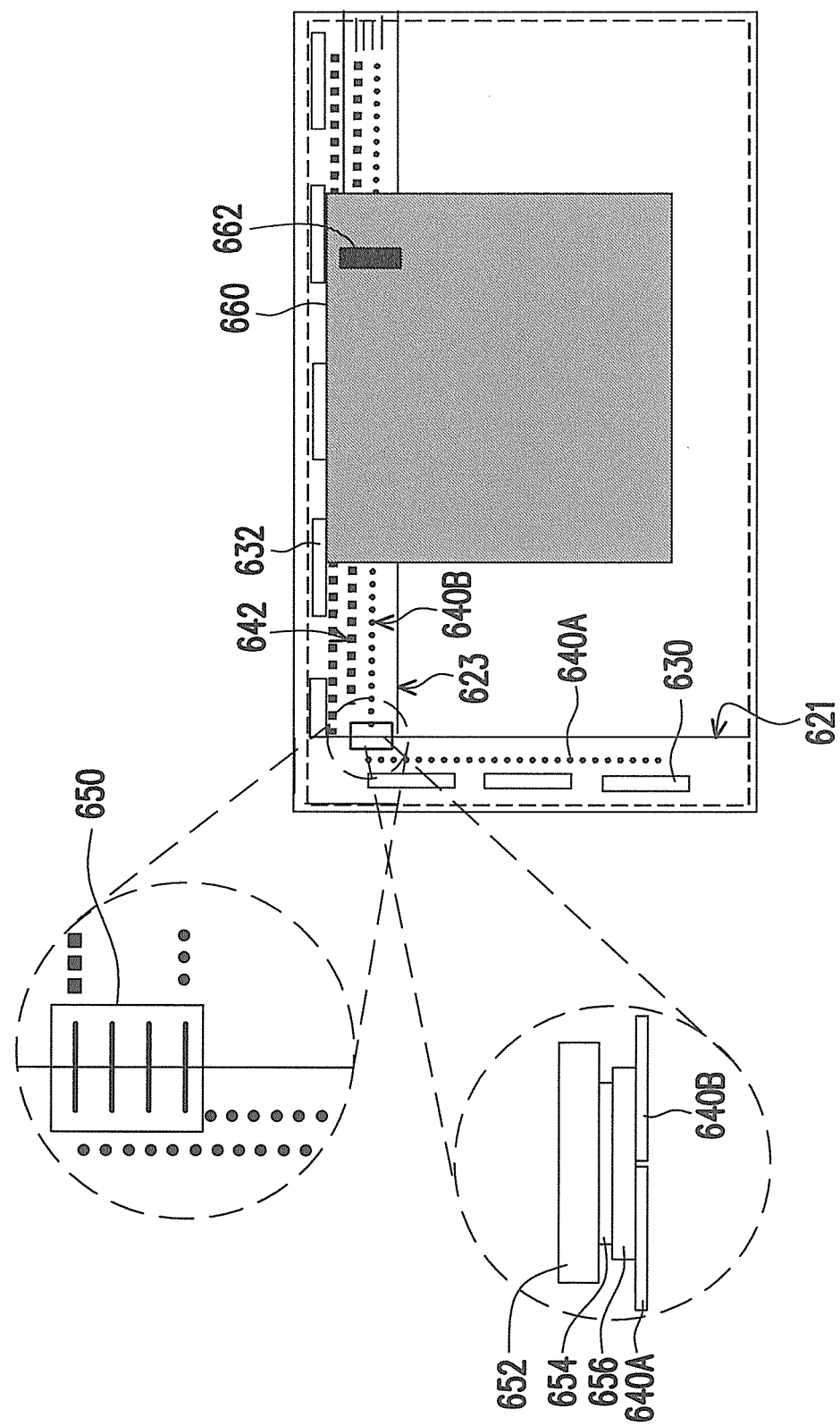

DISPLAY MODULE AND ASSEMBLY METHOD THEREOF

CROSS-REFERENCE TO RELATED APPLICATION

This application claims the priority benefit of Taiwan application serial no. 99130232, filed Sep. 7, 2010. The entirety of the above-mentioned patent application is hereby incorporated by reference herein and made a part of this specification.

TECHNICAL FIELD

The disclosure relates to a display module and an assembly method thereof.

BACKGROUND

Many flexible electronic products, such as E-paper and flexible display, have been developed along with the increasing demand for small-sized and light-weighted electronic products. The flexibility of such electronic products allows them to be applied to many more different fields.

In existing display techniques, a display panel and external printed circuit board (PCB) are usually connected through the tape automated bonding (TAB), the chip on glass (COG), or the chip on film (COF) technique by thermal bonding with anisotropic conductive film (ACF). FIG. 1 is a diagram illustrating the structure of a display panel and two external PCB connected through the TAB technique or the COF technique. Referring to FIG. 1, a display region 110 and a non-display region 120 are arranged on the display panel 100. The display panel 100 is connected to an external PCB 140 through a COF unit 130 so that a circuit 150 (for example, a data line or scan line circuit for providing pixel signals) on the display panel 100 can be electrically connected to the external PCB 140 through the COF 130.

In another display technique, a display panel with driver ICs is provided, wherein the driver ICs may be built in the panel through a system on panel (SOP) technique, or a driver IC chip may be bonded to the panel through a chip on panel (COP) technique. FIG. 2 is a diagram illustrating the structure of a display panel and an external PCB connected through the COP technique. Referring to FIG. 2, a display region 210 and a non-display region 220 are arranged on the display panel 200. The display panel 200 is connected to an external PCB 240 through a flexible printed circuit (FPC) 230. At least one driver IC 260 is disposed in the non-display region 220 of the display panel 200 through the COP technique, and a plurality of connective lines 250 for supplying signals or power is connected to the external PCB 240 through the FPC 230.

The structures described above, ether in COF or FPC example, both have a similar feature in which an additional flexible substrate other than that of the display panel is adopted and bonded onto the display panel in order to transmit electrical signals from external PCB to the display panel. Accordingly, the fabricating process is complicated and time-consuming, and the display panel is difficult to be replaced once it is bonded.

SUMMARY

A display module and an assembly method thereof are introduced herein.

The disclosure of a display module provides a flexible display panel including a plurality of pixels disposed within the display region, a plurality of connective lines, and at least one connection terminal. The display region, the connective lines, and the connection terminal are disposed on a same flexible substrate, and the connection terminal is arranged at an extension portion of a non-display region and electrically connected to at least one external circuit board, for receiving signals and transmitting the signals to the display region.

According to yet another exemplary embodiment of the disclosure, an assembly method of a display module provides a flexible display panel. In the assembly method, a flexible display panel having a display region, a connection terminal, and a plurality of connective lines is provided, wherein the display region, the connection terminal, and the connective lines are disposed on a first surface of a same flexible substrate. The flexible substrate has a first-side non-display region and a second-side non-display region, wherein the first-side non-display region and the second-side non-display region are arranged at two adjacent sides of the display region. The connective lines include a first-side connective line and a second-side connective line for respectively connecting pixels within the display region. The connection terminal is connected to an external circuit board. An extension portion is formed at the first-side non-display region, wherein one end of the extension portion is connected to a main body of the flexible display panel, and another end thereof is the connection terminal. The first-side non-display region and the second-side non-display region are folded backwards along two edges of the display region and pressed to a second surface of the flexible substrate, wherein the second surface is the wrong side of the first surface.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 2 is a diagram illustrating a display panel, having system on panel (SOP) technique or a chip on panel (COP) technique on it, and an external circuit (i.e., a printed circuit board (PCB)) bonded through a flexible printed circuit (FPC) technique.

FIGS. 6A-6B are diagrams illustrating how a flexible display panel is assembled according to an exemplary embodiment of the disclosure.

DETAILED DESCRIPTION OF DISCLOSED EMBODIMENTS

Figure 1:
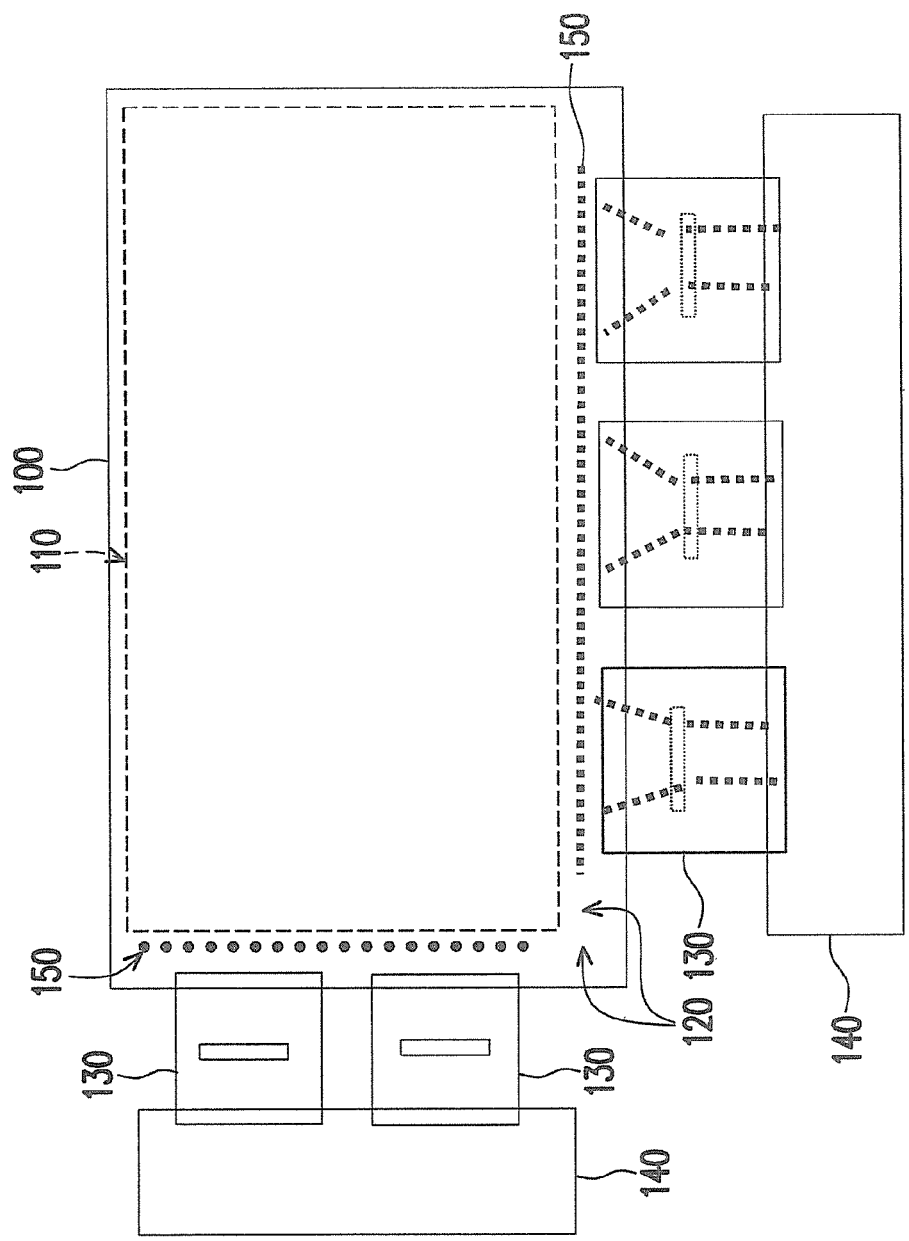
FIG. 1 is a diagram illustrating a display panel and two external circuit boards bonded through a tape automated bonding (TAB) technique or a chip on film (COF) technique.

An embodiment provides a flexible display panel including a display region, a connection terminal, and a plurality of connective lines, wherein the display region, the connection terminal, and the connective lines are disposed on a same flexible substrate. A plurality of pixels is arranged within the display region. The connection terminal is arranged at an extension portion of a non-display region of the flexible display panel. The connective lines respectively connect the pixels in the display region to the connection terminal at the extension portion. The connection terminal is connected to an external circuit (for example, a printed circuit board (PCB)) for receiving driving signals, which may include scan signals and data signals, and transmitting the same to the display region.

Another embodiment provides a flexible display panel including a display region, a connection terminal, a signal control region, and a plurality of connective lines, wherein the display region, the signal control region, the connection terminal, and the connective lines are disposed on a same flexible substrate. A plurality of pixels is arranged within the display region. The connection terminal is arranged at an extension portion of a non-display region of the flexible display panel. The signal control region having a plurality of driver integrated circuits (driver-ICs) is arranged at least one side of the display region, and which receives controlling signals from an external circuit through the connective lines and the connection terminal and drives the pixels within the display region.

In an exemplary embodiment, the connection terminal is connected to the external circuit (for example, a PCB) in a removable manner. Namely, the flexible display panel and the external PCB may be connected through a connector. In another exemplary embodiment, the connection terminal may also be connected to the external circuit through a thermal bonding technique by using solder, conductive paste, or an anisotropic conductive film (ACF). The flexible display panel is connected to the external PCB only through the connection terminal.

In an exemplary embodiment, the flexible substrate has a slit, and a strip-shaped bendable extension portion is formed at the sides of the non-display region, wherein one end of the strip-shaped extension portion is connected to a main body of the flexible display panel, and another end thereof is the connection terminal used for connecting to the external PCB. The shape, size, and bended position of the strip-shaped extension portion are determined according to the requirements in the module design of the flexible display panel.

In another exemplary embodiment, an assembly method of a flexible display panel is provided. In the assembly method, first, a flexible display panel having a display region, a connection terminal, and a plurality of connective lines is provided. The display region, the connection terminal, and the connective lines are disposed on a first surface of a same flexible substrate. The flexible substrate has a first-side non-display region and a second-side non-display region, wherein the first-side non-display region and the second-side non-display region are arranged at two adjacent sides of the display region. The connective lines include a first-side connective line and a second-side connective line for respectively connecting pixels in the display region to the connection terminal.

Then, a slit is formed on the first-side non-display region so as to form a strip-shaped bendable extension portion, wherein one end of the strip-shaped extension portion is connected to the main body of the flexible display panel, and the other end thereof is the connection terminal. The first-side connective line and the second-side connective line are both ran into the connection terminal. The shape, size, and bended position of the strip-shaped extension portion are determined according to the requirements in the module design of the flexible display panel.

Next, the first-side non-display region and the second-side non-display region are folded backwards along two edges of the display region and pressed to a second surface of the flexible substrate, wherein the second surface is the wrong side of the first surface.

Thereafter, the connection terminal is connected to an external PCB for receiving driving signals and transmitting the same to the display region. The display region and/or a small frame are substantially kept on one surface of the flexible display panel.

In another exemplary embodiment, an assembly method of a flexible display panel is provided. In the assembly method, first, a flexible display panel having a display region, a connection terminal, and a plurality of connective lines is provided. The display region, the connection terminal, and the connective lines are disposed on a first surface of a same flexible substrate. The flexible substrate has a first-side non-display region and a second-side non-display region, wherein the first-side non-display region and the second-side non-display region are arranged at two adjacent sides of the display region. The first-side non-display region and the second-side non-display region are extended along two sides of the display region, and a corner partition space is formed between the first-side non-display region and the second-side non-display region. The connective lines are respectively disposed within the first-side non-display region and the second-side non-display region and include a first-side connective line and a second-side connective line for respectively connecting pixels in the display region to the connection terminal.

Then, a slit is formed on the first-side non-display region so as to form a strip-shaped bendable extension portion, wherein one end of the strip-shaped extension portion is connected to the main body of the flexible display panel, and the other end thereof is the connection terminal. The shape, size, and bended position of the strip-shaped extension portion are determined according to the requirements in the module design of the flexible display panel.

Thereafter, the first-side non-display region and the second-side non-display region are folded backwards along two edges of the display region and pressed to a second surface of the flexible substrate, wherein the second surface is the wrong side of the first surface.

Next, a connection pad is provided to align and connect the second-side connective line in the second-side non-display region to a portion of the first-side connective line in the first-side non-display region, so that the second-side connective line can be ran into the connection terminal through the portion of the first-side connective line.

After that, the connection terminal is connected to an external PCB to receive driving signals and transmit the same to the display region. The display region and/or a small frame are substantially kept on a surface of the flexible display panel.

In another exemplary embodiment, an assembly method of a flexible display panel is provided. In the assembly method, first, a flexible display panel having a display region, a signal control region having driver-ICs thereon, a connection terminal, and a plurality of connective lines is provided. The display region, the signal control region, the connection terminal, and the connective lines are disposed on a first surface of a same flexible substrate. The flexible substrate has a first-side non-display region and a second-side non-display region, wherein the first-side non-display region and the second-side non-display region are arranged at two adjacent sides of the display region. The first-side non-display region and the second-side non-display region are extended along two sides of the display region, and a corner partition space is formed between the first-side non-display region and the second-side non-display region. A first signal control region and a second signal control region are respectively arranged in the first-side non-display region and the second-side non-display region. The connective lines are respectively disposed in the first-side non-display region and the second-side non-display region and include a first-side connective line and a second-side connective line for respectively electrically connecting the connection terminal with the first signal control region and the second signal control region.

Then, a slit is formed on the first-side non-display region to form a strip-shaped bendable extension portion, wherein one end of the strip-shaped extension portion is connected to the main body of the flexible display panel, and the other end thereof is the connection terminal. The shape, size, and bended position of the strip-shaped extension portion are determined according to the requirements in the module design of the flexible display panel.

Thereafter, the first-side non-display region and the second-side non-display region are folded backwards along two edges of the display region and pressed to a second surface of the flexible substrate, wherein the second surface is the wrong side of the first surface.

Next, a connection pad is provided to align and connect the second-side connective line in the second-side non-display region to a portion of the first-side connective line in the first-side non-display region, so that the second-side connective line can be ran into the connection terminal through the portion of the first-side connective line.

After that, the connection terminal is connected to an external PCB to receive controlling signals and transmit the same to the first signal control region and the second signal control region, so that the display region can be controlled according to the driving signals to display images.

In an exemplary embodiment, the connection terminal is connected to the external PCB in a removable manner. Namely, the flexible display panel and the external PCB are connected through a connector. In another exemplary embodiment, the connection terminal may also be connected to the external PCB through thermal bonding by using solder, conductive paste, or an ACF. The flexible display panel is connected to the external PCB only through the connection terminal.

In other embodiments, the flexible display panel may have a plurality of connection terminals respectively connected to different positions on the external PCB.

Below, exemplary embodiments of the flexible display panel and the assembly method thereof will be described with reference to accompanying drawings. However, these exemplary embodiments are not intended to limit the scope of the disclosure.

Figure 3A:
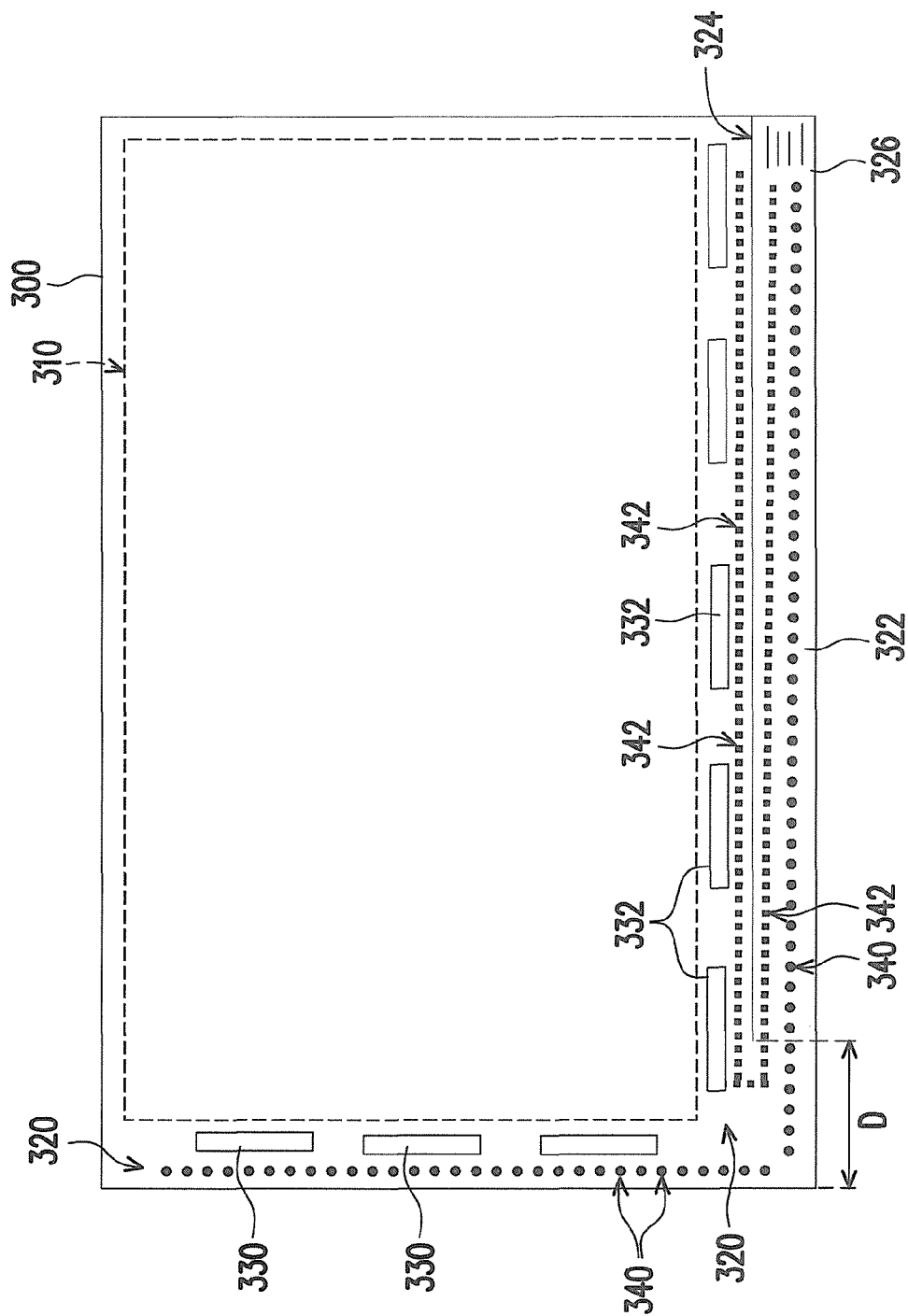
FIGS. 3A-3D are diagrams illustrating different implementation examples of a flexible display panel.

FIG. 3A is a diagram of a flexible display panel according to an exemplary embodiment. Referring to FIG. 3A, the flexible display panel is formed on a flexible substrate 300, and which has a display region 310 and a non-display region 320. In an embodiment, the flexible substrate 300 may be made of a high molecular material (for example, polyethylene terephthalate (PET), polyethersulfone (PES), polyethylene naphthalate (PEN), or polyimide (PI), etc) or a metal material (for example, aluminum, copper, silver, or stainless steel, etc). A plurality of pixels is arranged within the display region 310. The non-display region 320 of the flexible display panel further includes a plurality of signal control regions 330 and 332, a connection terminal 326, and two groups of connective lines 340 and 342. In the exemplary embodiment, the non-display region 320 has a slit 324, and a strip-shaped bendable extension portion 322 is formed at the sides of the non-display region 320, wherein one end of the strip-shaped extension portion 322 is connected to the main body of the flexible display panel on the flexible substrate 300, and the connected portion has a length D, as shown in FIG. 3A. The shape, size, and bended position of the strip-shaped extension portion 322 can be determined according to the requirements in the module design of the flexible display panel. Besides, the other end of the strip-shaped extension portion 322 is the connection terminal 326 for connecting to an external PCB. Image data processing, timing control, and power conversion circuits are disposed on the external PCB.

The signal control regions 330 and 332 respectively have driver-ICs and the corresponding connective lines 340 and 342. The connective lines 340 and 342 include circuits for supplying signals and power, and which respectively electrically connect a driver IC in the signal control regions 330 and 332 to the pixel units in the display region 310 and the connection terminal 326, so that the driver IC in the signal control regions 330 and 332 can receive controlling signals from the external PCB and drive the pixels in the display region 310.

In the exemplary embodiment, the flexible substrate 300 includes one connection terminal 326, while in another embodiment, the flexible substrate 300 may also include a plurality of connection terminals. The connection terminal 326 may be connected to the external PCB in a removable manner. Namely, the flexible display panel and the external PCB may be connected through a connector. In another exemplary embodiment, the connection terminal 326 may also be bonded to the external PCB by using a conductive bonding material, such as solder, conductive paste, or an ACF. The flexible display panel is connected to the external PCB only through the connection terminal 326. In another different embodiment, the flexible display panel may have two connection terminals (for example, one connection terminal corresponding to scan lines, and another connection terminal corresponding to data lines) respectively connected to different positions on the external PCB.

The driver ICs in the signal control regions 330 and 332 include data driver IC and scan driver IC. The data driver IC may be a source driver IC which arranges data input, offers high frequency, and drives the pixels to display images. The scan driver IC may be a gate driver IC and used for controlling the input of data. The driver IC in the signal control regions 330 and 332 may be disposed on the flexible display panel through a system on panel (SOP) technique or a chip on panel (COP) technique.

The pixel units in the display region 310 may be composed of an organic light emitting diode (OLED) layer, a liquid crystal display (LCD) layer, a cholesteric liquid crystal display (ChLCD) layer, an electrophoretic display (EPD) layer, an electrowetting display (EWD) layer, an electrochromic display (ECD) layer, and a quick response liquid-powder display (QR-LPD) layer or may be other display units that can be disposed on the flexible substrate. The pixel units are driven through a passive matrix (PM), an active matrix (AM), or a segmented driving technique.

Figure 3B:
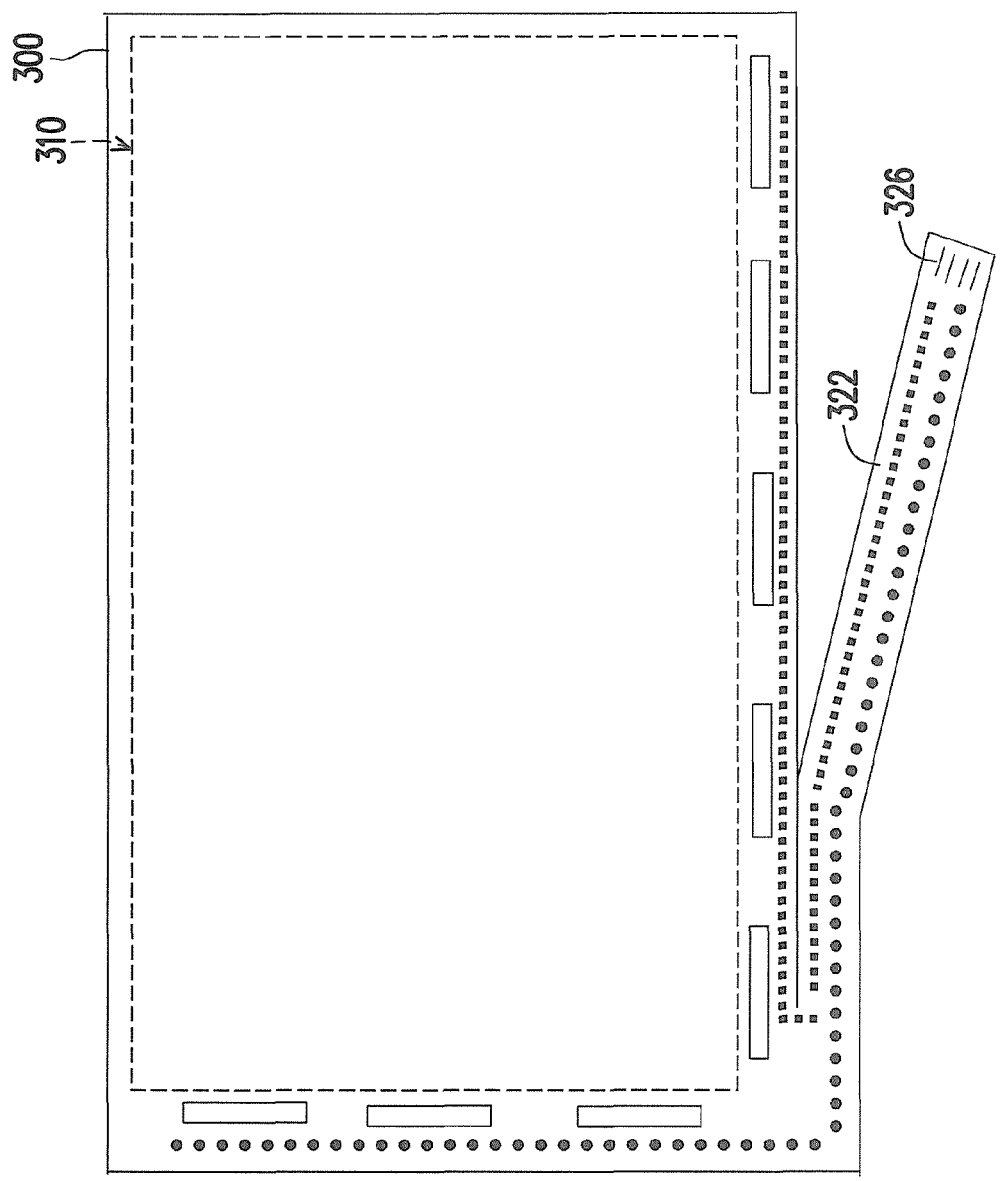

FIG. 3B is a diagram illustrating another embodiment of the strip-shaped extension portion of the flexible display panel illustrated in FIG. 3A. Referring to FIG. 3B, the shape, size, and bended position of the strip-shaped extension portion 322 can be determined according to the requirements in the module design of the flexible display panel. Besides, the other end of the strip-shaped extension portion 322 is connected to the connection terminal 326 for connecting the connection terminal 326 to an external PCB.

Figure 3C:
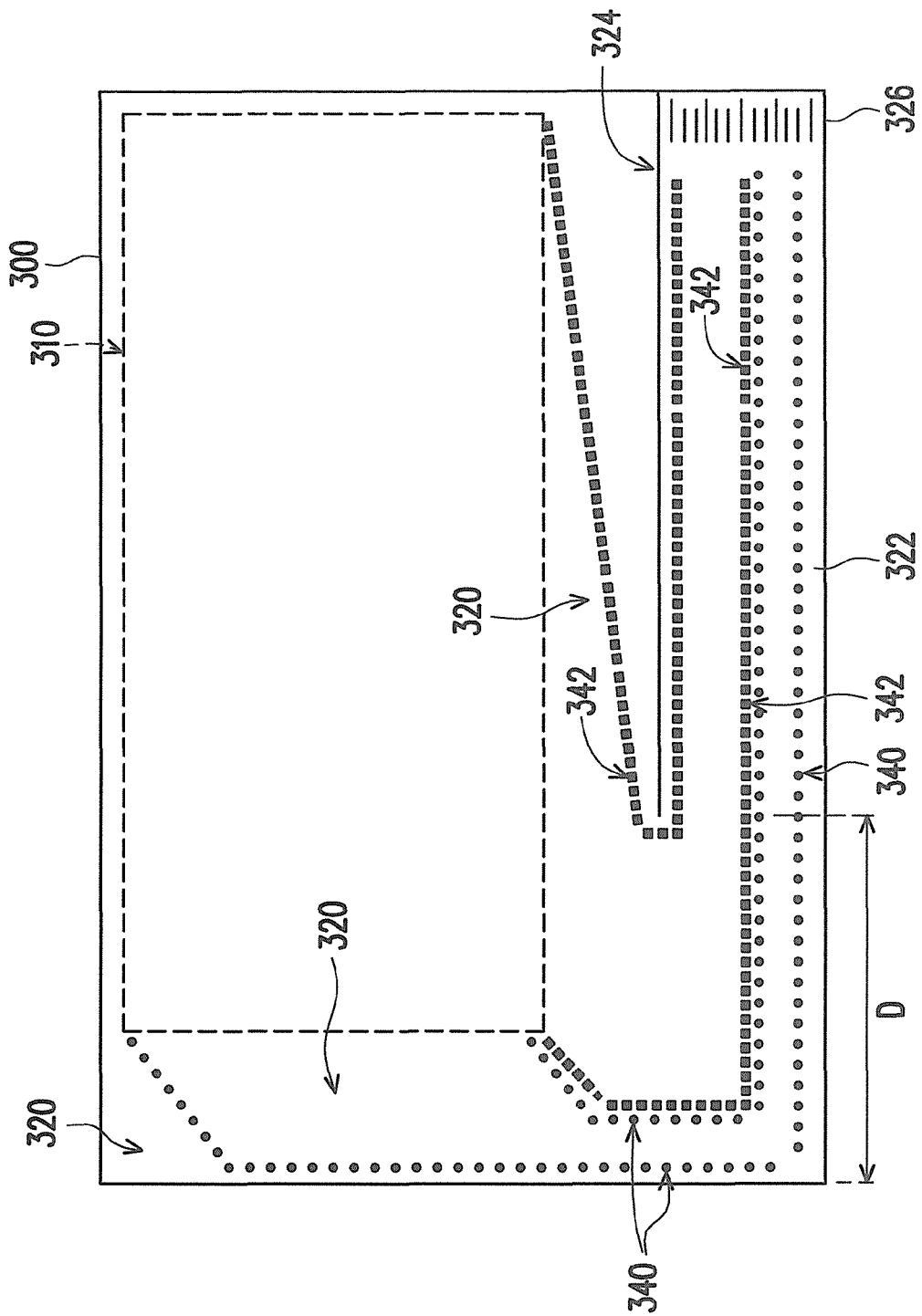

FIG. 3C is a diagram of a flexible display panel according to another exemplary embodiment. This flexible display panel has a structure similar to that illustrated in FIG. 3A, wherein like elements and regions are denoted with like reference numerals and will not be described herein. The difference between the two flexible display panels is that the signal control region (i.e., the data driver IC and the scan driver IC) may be omitted in the flexible display panel illustrated in FIG. 3C. The pixel units in the display region 310 are directly connected to the connection terminal 326 respectively through the connective lines 340 and 342, and the connection terminal 326 directly receives scan and data signals from the external PCB, which has one or more driver ICs thereon, and drives the pixels in the display region 310 to display images according to these signals.

Figure 3D:
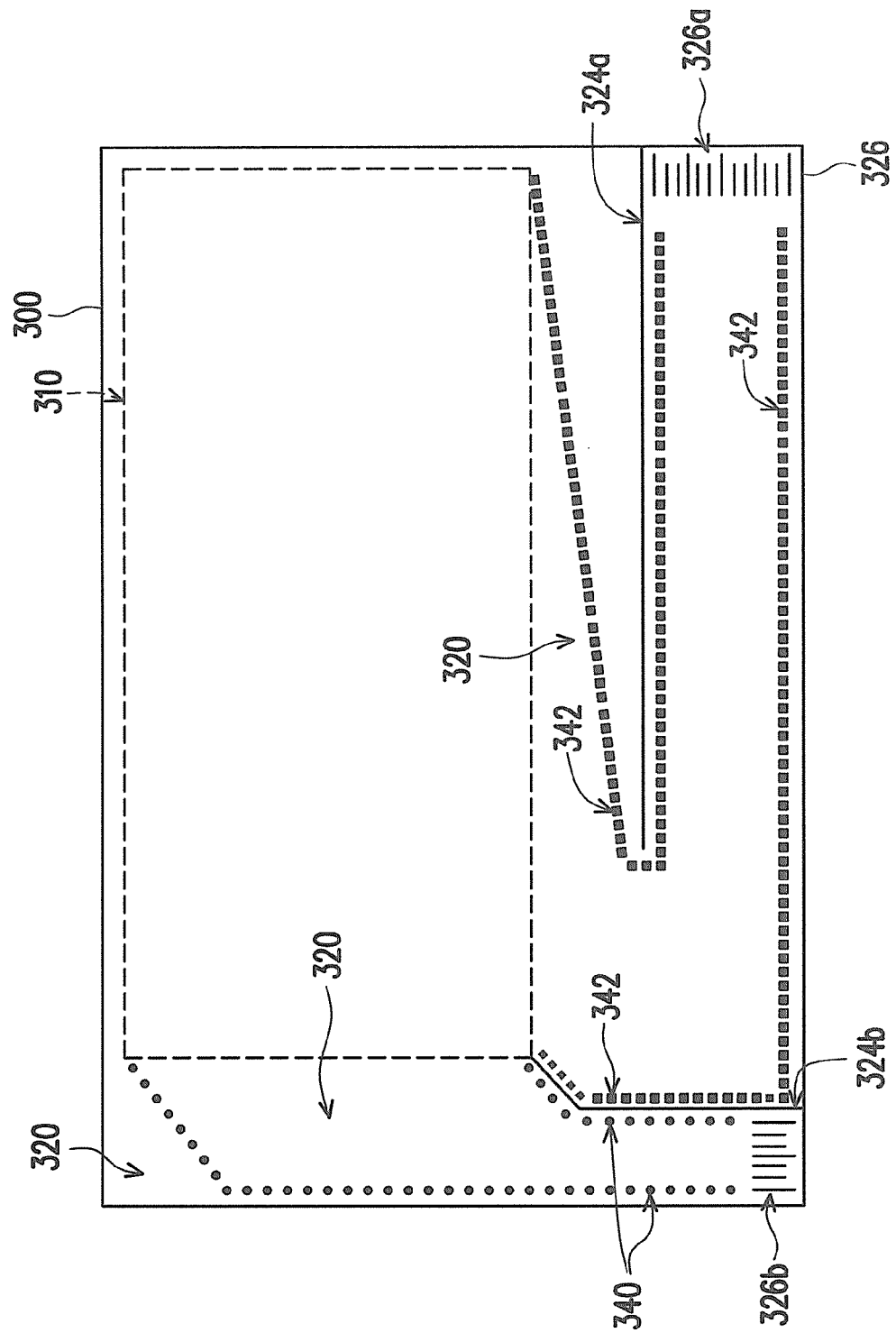

FIG. 3D is a diagram of a flexible display panel according to yet another exemplary embodiment. This flexible display panel has a structure similar to that illustrated in FIG. 3C, wherein like elements are denoted with like reference numerals and will not be described herein. The difference between the flexible display panel and that illustrated in FIG. 3C is that slits 324a and 324b are formed respectively corresponding to the connective lines 342 and 340, and data signals and driving signals are received from the external PCB through the connection terminal 326a and the connection terminal 326b for driving pixels in the display region 310 to display images. Preferably, in the embodiment, the connection terminals 326a and the 326b are bonded to the external PCB.

Figure 4:
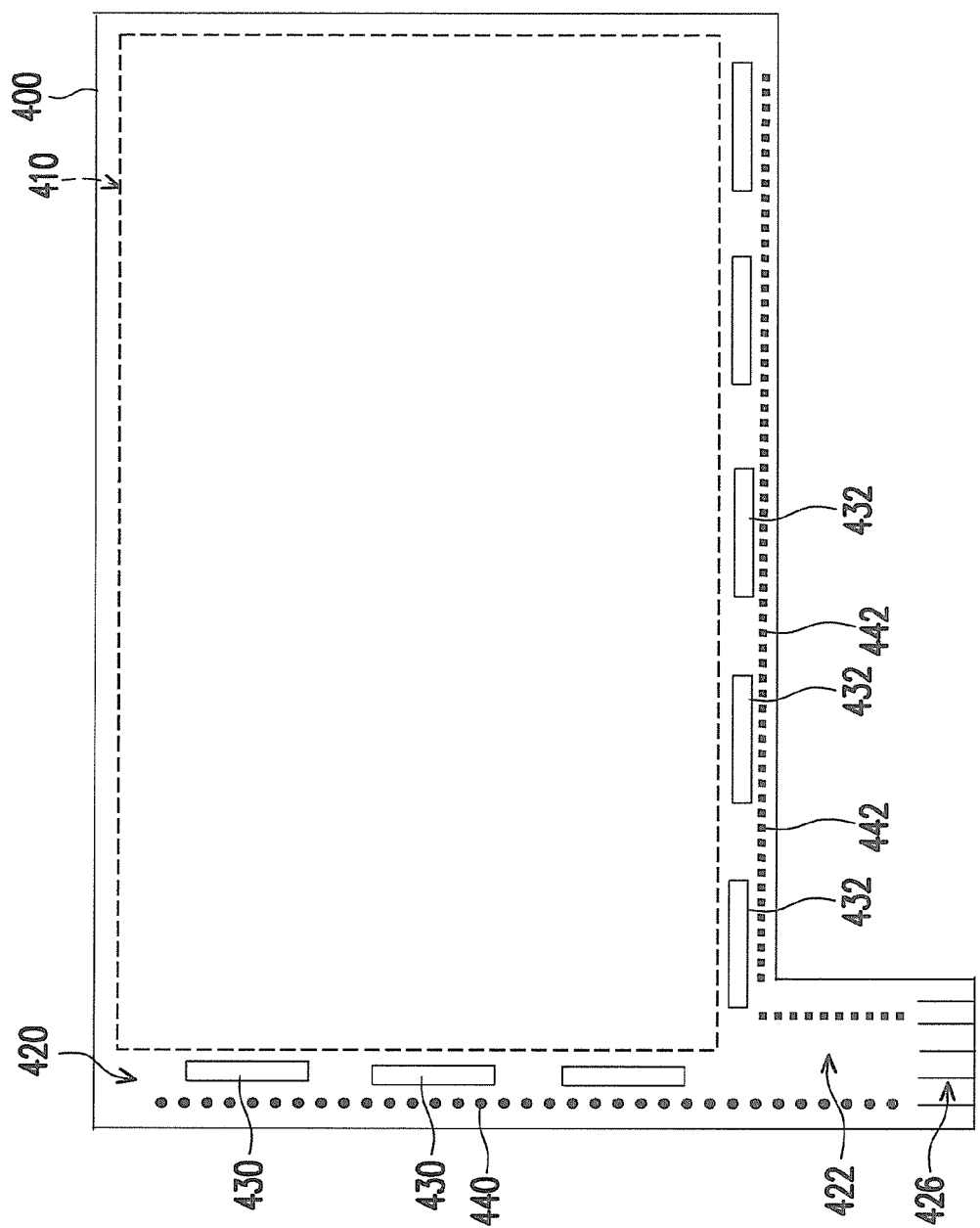
FIG. 4 is a diagram of a flexible display panel according to an embodiment of the disclosure.

FIG. 4 is a diagram of a flexible display panel according to another exemplary embodiment of the disclosure. The flexible display panel is formed on a flexible substrate 400 and includes a display region 410 and a non-display region 420. A plurality of pixels is arranged within the display region 410. The non-display region 420 of the flexible display panel further includes a plurality of signal control regions 430 and 432, a connection region 426, and two groups of connective lines 440 and 442. A strip-shaped bendable extension portion 422 is formed at a corner of the non-display region 420, wherein one end of the strip-shaped extension portion 422 is connected to the main body of the flexible display panel on the flexible substrate 400, and the other end of the strip-shaped extension portion 422 is connected to the connection terminal 426 for connecting the connection terminal 426 to an external PCB.

Along with the increase in the size and the improvement in the display quality of display panels, requirements to driving ability and operation frequency of driver ICs have been increasingly produced. Thus, a technique of disposing different driver ICs respectively at three or four sides of a display panel is provided to improve the driving ability and operation frequency or to satisfy other design requirements. For example, a data driver IC is respectively disposed at the upper and lower sides, and a scan driver IC is respectively disposed at the left and right sides. Please refer to FIG. 5 for an example of such design.

Figure 5:
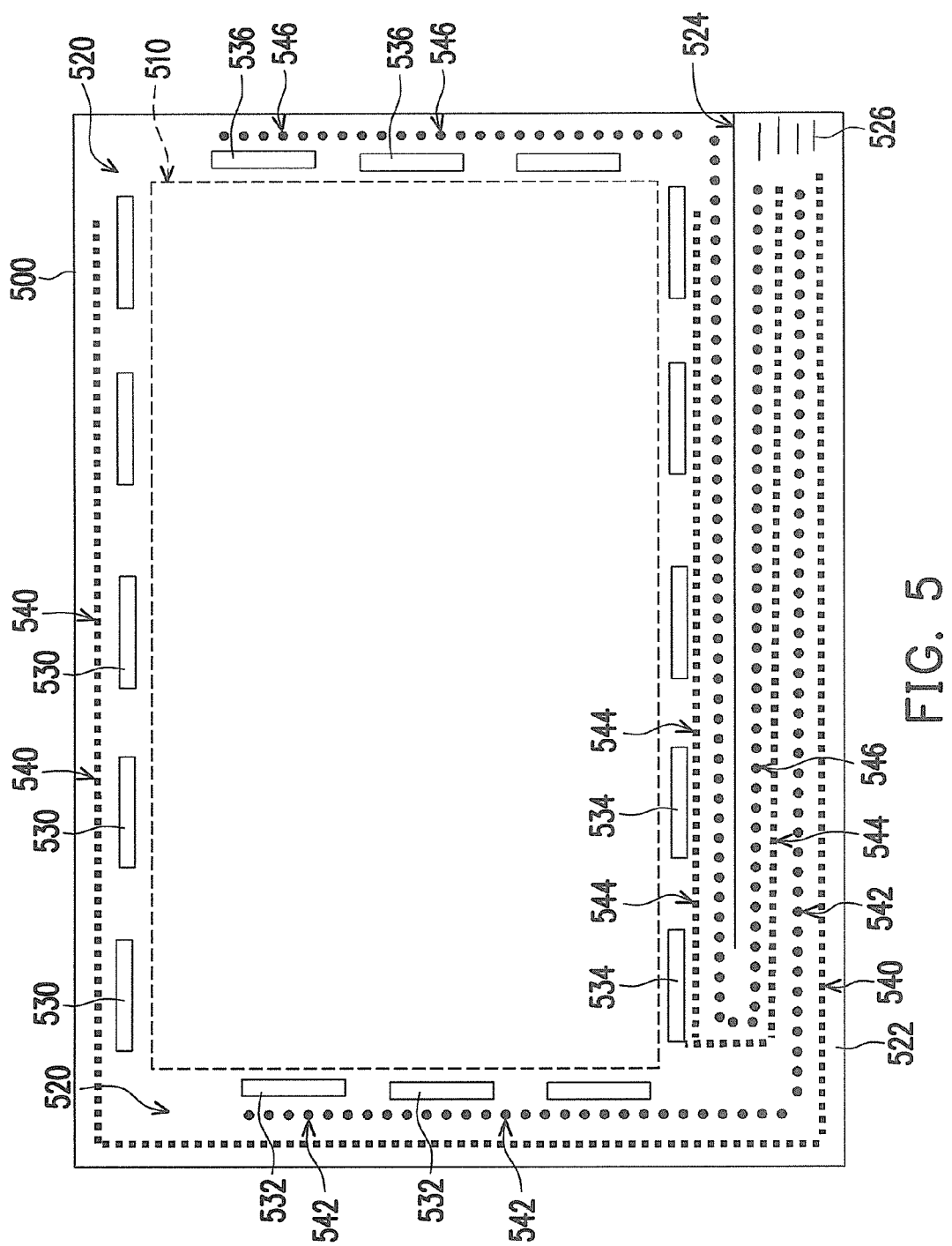
FIG. 5 is a diagram illustrating an example of a flexible display panel.

FIG. 5 is a diagram of a flexible display panel according to an exemplary embodiment. Referring to FIG. 5, the flexible display panel is formed on a flexible substrate 500 and includes a display region 510 and a non-display region 520. A plurality of pixels is arranged within the display region 510. The non-display region 520 of the flexible display panel further includes a plurality of signal control regions (for example, the signal control regions 530, 532, 534, and 536 in FIG. 5), a connection terminal 526, and four groups of connective lines (for example, the connective lines 540, 542, 544, and 546 in FIG. 5). In the exemplary embodiment, the non-display region 520 has a slit 524, and a strip-shaped bendable extension portion 522 is formed at the sides of the non-display region 520, wherein one end of the strip-shaped extension portion 522 is connected to the main body of the flexible display panel on the flexible substrate 500. The shape, size, and bended position of the strip-shaped extension portion 522 can be determined according to the requirements in the module design of the flexible display panel. Besides, the other end of the strip-shaped extension portion 522 is connected to the connection terminal 526 for connecting the connection terminal 526 to an external PCB.

The signal control regions 530, 532, 534, and 536 respectively have the connective lines 540, 542, 544, and 546. The connective lines 540, 542, 544, and 546 respectively electrically connect the driver ICs in the signal control regions 530, 532, 534, and 536 to the pixel units in the display region 510 and the connection terminal 526 so that the driver ICs in the signal control regions 530, 532, 534, and 536 can receive controlling signals and power supply from the external PCB and drive the pixels in the display region 510.

In an exemplary embodiment, the connection terminal 526 may be connected to the external PCB in a removable manner. Namely, the flexible display panel and the external PCB are connected through a connector. In another exemplary embodiment, the connection terminal 526 may also be bonded to the external PCB by using a conductive bonding material, such as solder, conductive paste, or an ACF. The flexible display panel is connected to the external PCB only through the connection terminal 526. In different exemplary embodiments, the flexible display panel may have two or more connection regions respectively connected to different positions of the external PCB.

The driver ICs in the signal control regions 530, 532, 534, and 536 may include data driver ICs and scan driver ICs. The driver ICs in the signal control regions 530, 532, 534, and 536 may be disposed on the flexible display panel through a SOP technique or a COP technique.

The pixel units in the display region 510 may be composed of an OLED layer, a LCD layer, a ChLCD layer, an EPD layer, an EWD layer, an ECD layer, and a QR-LPD layer or may be other display units that can be disposed on the flexible substrate.

An assembly method is provided regarding the flexible display panel illustrated in FIG. 5. The non-display region 520 around the display region 510 is folded backwards along the edges of the display region 510 and pressed onto the rear surface of the flexible substrate 500. Then, the connection terminal 526 is connected to a PCB for receiving controlling signals and transmitting the same to the display region. In an embodiment, the PCB is attached onto the rear surface of the flexible display panel to constitute a display panel module, and only the display region and/or a small frame are substantially kept on one side of the assembled display module. Such a frameless or narrow-framed design effectively increases the display area of the entire display or brings an aesthetic feeling to the appearance of the display.

Figure 6A:
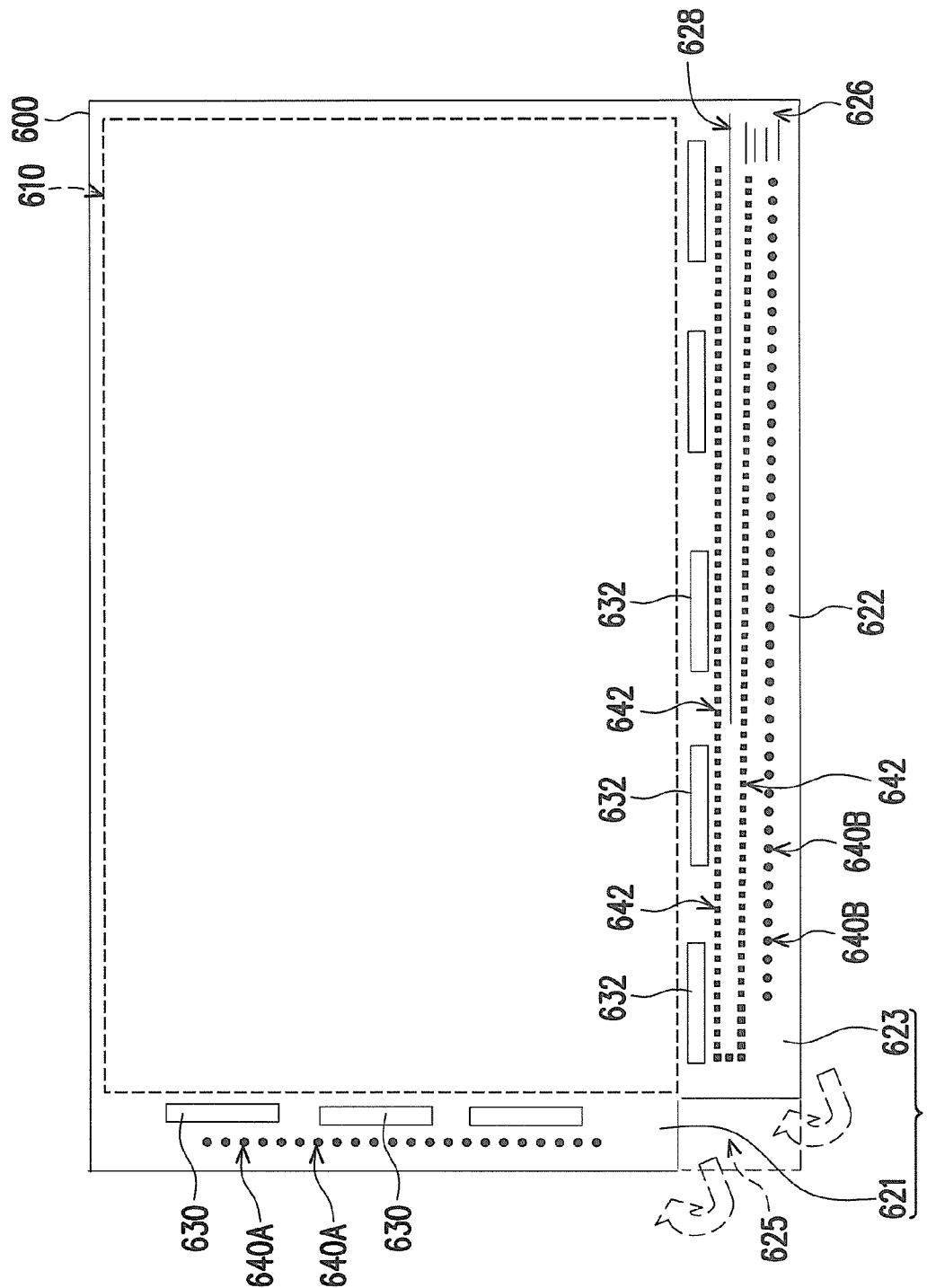

FIG. 6A is a diagram of a flexible display panel and assembly thereof according to an exemplary embodiment. Referring to FIG. 6A, the flexible display panel is formed on a flexible substrate 600 and includes a display region 610 and a non-display region 620. A plurality of pixels is arranged within the display region 610. The non-display region 620 of the flexible display panel further include a plurality of signal control regions 630 and 632, a connection terminal 626, and three groups of connective lines 640A, 640B, and 642. In the exemplary embodiment, the non-display region 620 includes a first-side non-display region 621 and a second-side non-display region 623.

The first-side non-display region 621 and the second-side non-display region 623 are arranged at two adjacent sides of the display region 610, and a corner partition space 625 is formed between the first-side non-display region 621 and the second-side non-display region 623. Such an arrangement allows the corners to be neatly pressed to the rear surface of the flexible substrate 600 when the first-side non-display region 621 and the second-side non-display region 623 are folded backwards along the edges of the display region 610.

A slit 628 is formed in the second-side non-display region 623, and a strip-shaped bendable extension portion 622 is formed at the sides of the second-side non-display region 623, wherein one end of the strip-shaped extension portion 622 is connected to the main body of the second-side non-display region 623. The shape, size, and bended position of the strip-shaped extension portion 622 can be determined according to the requirements in the module design of the flexible display panel. Besides, the other end of the strip-shaped extension portion 622 is connected to the connection terminal 626 for connecting the connection terminal 626 to an external PCB.

Such a layout allows the signal control region 632 in the second-side non-display region 623 to be electrically connected to the connection terminal 626 through the connective lines 642. However, because the first-side non-display region 621 and the second-side non-display region 623 are separated by a corner partition space 625, the signal control region 630 in the first-side non-display region 621 cannot be electrically connected to the connection terminal 626 through the connective lines 640A. Thus, another connective lines 640B has to be disposed in the second-side non-display region 623. When the first-side non-display region 621 and the second-side non-display region 623 are folded backwards along the edges of the display region 610 and pressed to the rear surface of the flexible substrate 600, the connective lines 640A and the connective line 640B are connected through an electrical connection structure.

Aforementioned electrical connection structure may be a connection pad structure, as illustrated in FIG. 6B. FIG. 6B is a diagram illustrating a connection pad structure for electrically connecting internal circuits when the first-side non-display region and the second-side non-display region are folded backwards along the edges of the display region and pressed to the rear surface of the flexible substrate. As shown in FIG. 6B, in the embodiment, the connection pad structure 650 is composed of an insulation layer 652, a conductive bridge 654, and an ACF 656 that are stacked together. The connective lines 640A and the connective lines 640B are electrically bonded together by using the ACF 656. In an embodiment, the connection pad structure 650 may also be connected by using solder.

In another embodiment, the corner partition space is not disposed, and the connective lines 640A and the connective lines 640B are directly connected to the flexible substrate 600 so that the connection pad structure is not needed. However, when the first-side non-display region 621 and the second-side non-display region 623 are folded backwards along the edges of the display region 610 and pressed to the rear surface of the flexible substrate 600, the connective lines at the corners should be insulation reinforced to prevent any short circuit from being produced at the folded portions.

The connective lines 640A and 640B are corresponding to the signal control region 630, and the connective lines 642 is corresponding to the signal control region 632. The driver ICs in the signal control regions 630 and 632 are electrically connected to the pixel units in the display region 610 and the connection terminal 626 through the connective lines 640A, 640B, and 642, and the connection terminal 626 is electrically connected to a connection port 662 of a PCB 660. Such a structure allows the driver ICs in the signal control regions 630 and 632 to receive controlling signals from the PCB 660 and drive the pixels in the display region 610.

In an exemplary embodiment, the connection terminal 626 is electrically connected to the connection port 662 of the PCB 660 in a removable manner. Namely, the flexible display panel and the external PCB are connected through a connector. In another exemplary embodiment, the connection terminal 626 may also be electrically bonded to the connection port 662 of the PCB 660 by using a conductive bonding material, such as solder, conductive paste, or an ACF. The flexible display panel is connected to the PCB 660 only through the connection terminal 626.

The driver ICs in the signal control regions 630 and 632 may include data driver ICs and scan driver ICs. The data driver ICs may be source driver ICs which arrange data input, offer high frequency, and drive the pixels to display images. The scan driver ICs may be gate driver ICs which control the input of data. The driver ICs in the signal control regions 630 and 632 are disposed on the flexible display panel through a SOP or a COP technique.

The display region 610 may be composed of an OLED layer, a LCD layer, a ChLCD layer, an EPD layer, an EWD layer, an ECD layer, and a QR-LPD layer or may be other display units that can be disposed on the flexible substrate.

Figure 6C:
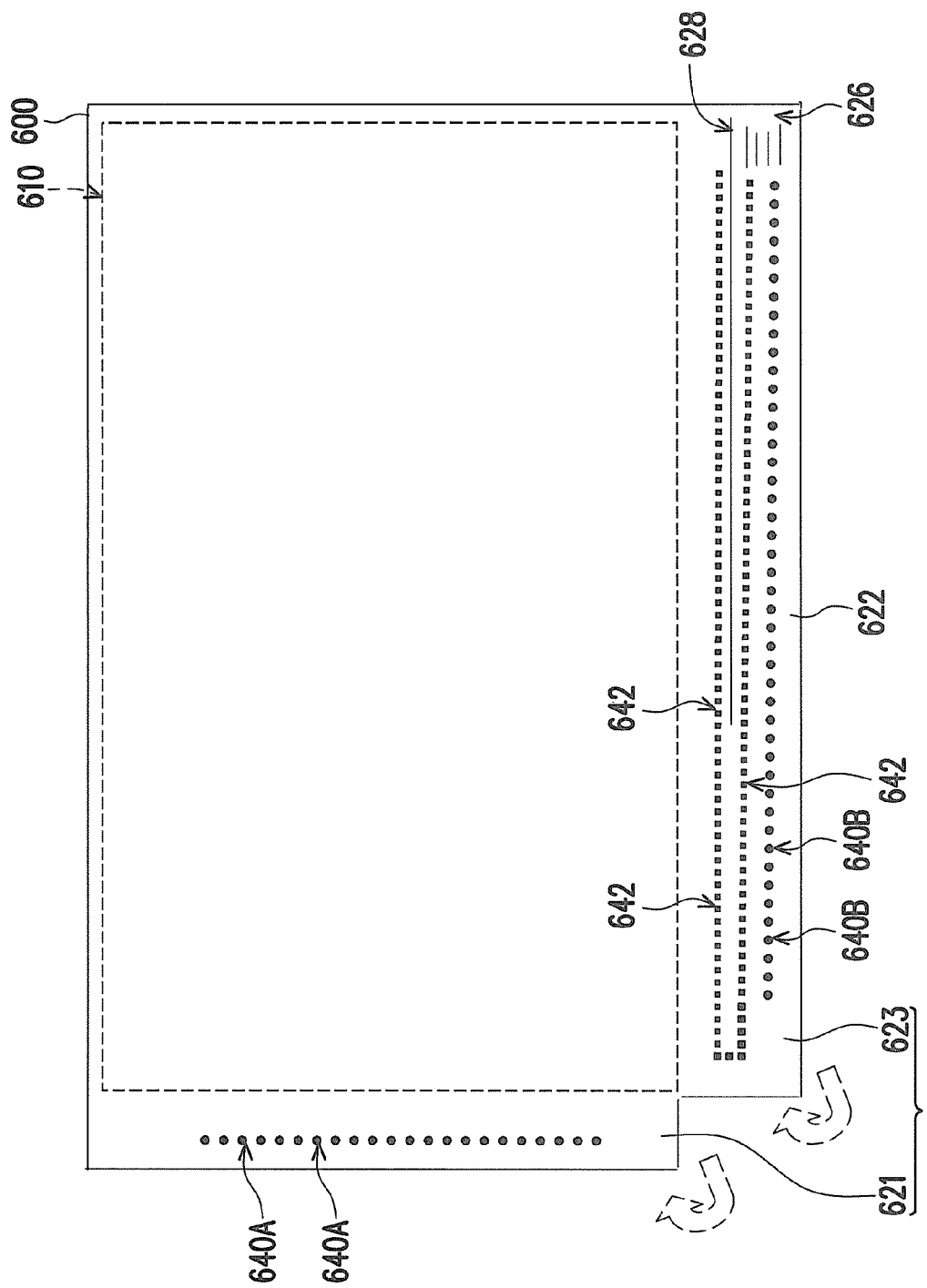
FIG. 6C is a diagram of a flexible display panel according to an embodiment of the disclosure.

FIG. 6C is a diagram of a flexible display panel according to another exemplary embodiment. This flexible display panel has a structure similar to that illustrated in FIG. 6A, where like elements are denoted with like reference numerals and will not be described herein. The difference between the two flexible display panels is that the flexible display panel in FIG. 6C has no signal control region (i.e., the driver ICs, such as data driver ICs and scan driver ICs), the pixel units in the display region 610 are directly connected to the connection terminal 626 respectively through the connective lines 640A, 640B, and 642, and data signals and driving signals are directly received from the external PCB, which has one or more driver ICs disposed thereon, for controlling the pixels in the display region 610 to display images.

Different driver ICs may be respectively disposed at four sides of the flexible display panel in order to improve the driving ability and operation frequency. For example, a data driver IC is respectively disposed at the upper and the lower sides, and a scan driver IC is respectively disposed at the left and right sides. An exemplary embodiment of the frameless display panel illustrated in FIG. 6A with four driver ICs will be described below with reference to FIG. 7A.

Figure 7A:
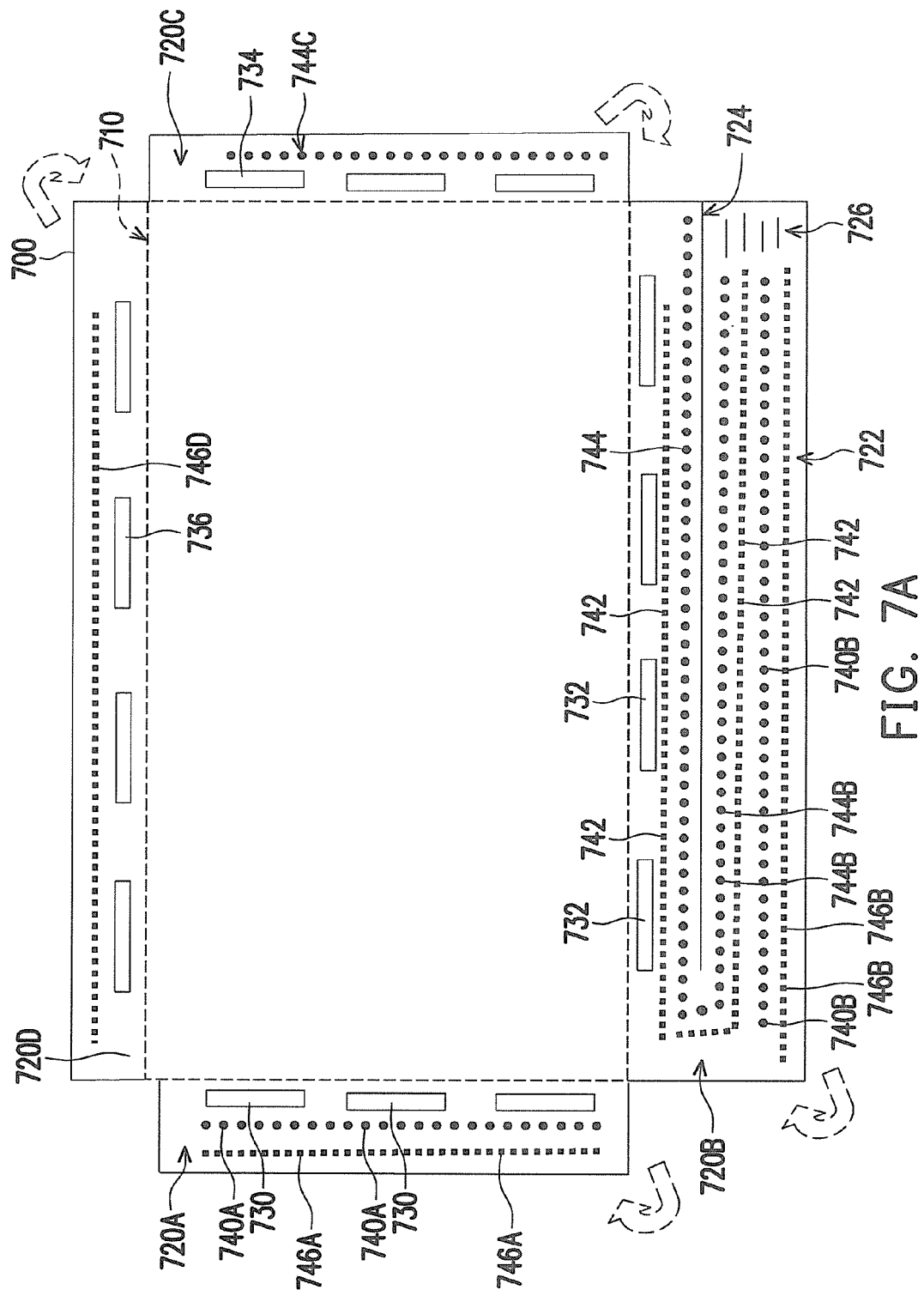
FIGS. 7A-7B are diagrams illustrating how a flexible display panel is assembled according to another exemplary embodiment of the disclosure.

FIG. 7A is a diagram of a flexible display panel according to an exemplary embodiment. Referring to FIG. 7A, the flexible display panel is formed on a flexible substrate 700 and includes a display region 710 and a non-display region 720. A plurality of pixels is arranged within the display region 710. The non-display region 720 of the flexible substrate 700 further includes a plurality of signal control regions (for example, the signal control regions 730, 732, 734, and 736 in FIG. 7A), a connection terminal 726, and a plurality of connective lines (for example, the conductive lines 740A, 740B, 742, 744B, 744C, 746A, 746B, and 746D in FIG. 7A).

The non-display region 720 includes a first-side non-display region 720A, a second-side non-display region 720B, a third-side non-display region 720C, and a fourth-side non-display region 720D arranged at four sides of the display region 710. A corner partition space is formed at each adjacent side. Such an arrangement allows the corners to be neatly pressed to the rear surface of the flexible substrate 700 when these non-display regions are folded backwards along the edges of the display region 710.

In the exemplary embodiment, a slit 724 is formed in the second-side non-display region 720B, and a strip-shaped bendable extension portion 722 is formed at the sides of the second-side non-display region 720B, wherein one end of the strip-shaped extension portion 722 is connected to the main body of the flexible display panel on the flexible substrate 700. The shape, size, and bended position of the strip-shaped extension portion 722 can be determined according to the requirements in the module design of the flexible display panel. Besides, the other end of the strip-shaped extension portion 722 is connected to the connection terminal 726 for connecting the connection terminal 726 to the external PCB.

The signal control region 732 in the second-side non-display region 720B is electrically connected to the connection terminal 726 through the connective lines 742. However, because the first-side non-display region 720A, the third-side non-display region 720C, the fourth-side non-display region 720D, and the second-side non-display region 720B are electrically separated from each other by corner partition spaces, the circuit layout thereof has to be adjusted. As shown in FIG. 7A, the fourth-side non-display region 720D is electrically connected to the connection terminal 726 sequentially through the connective lines 746D, 746A, and 746B. Besides, the first-side non-display region 720A is electrically connected to the connection terminal 726 sequentially through the connective lines 740A and 740B, and the third-side non-display region 720C is electrically connected to the connection terminal 726 sequentially through the connective lines 744C and 744B.

Figure 7B:
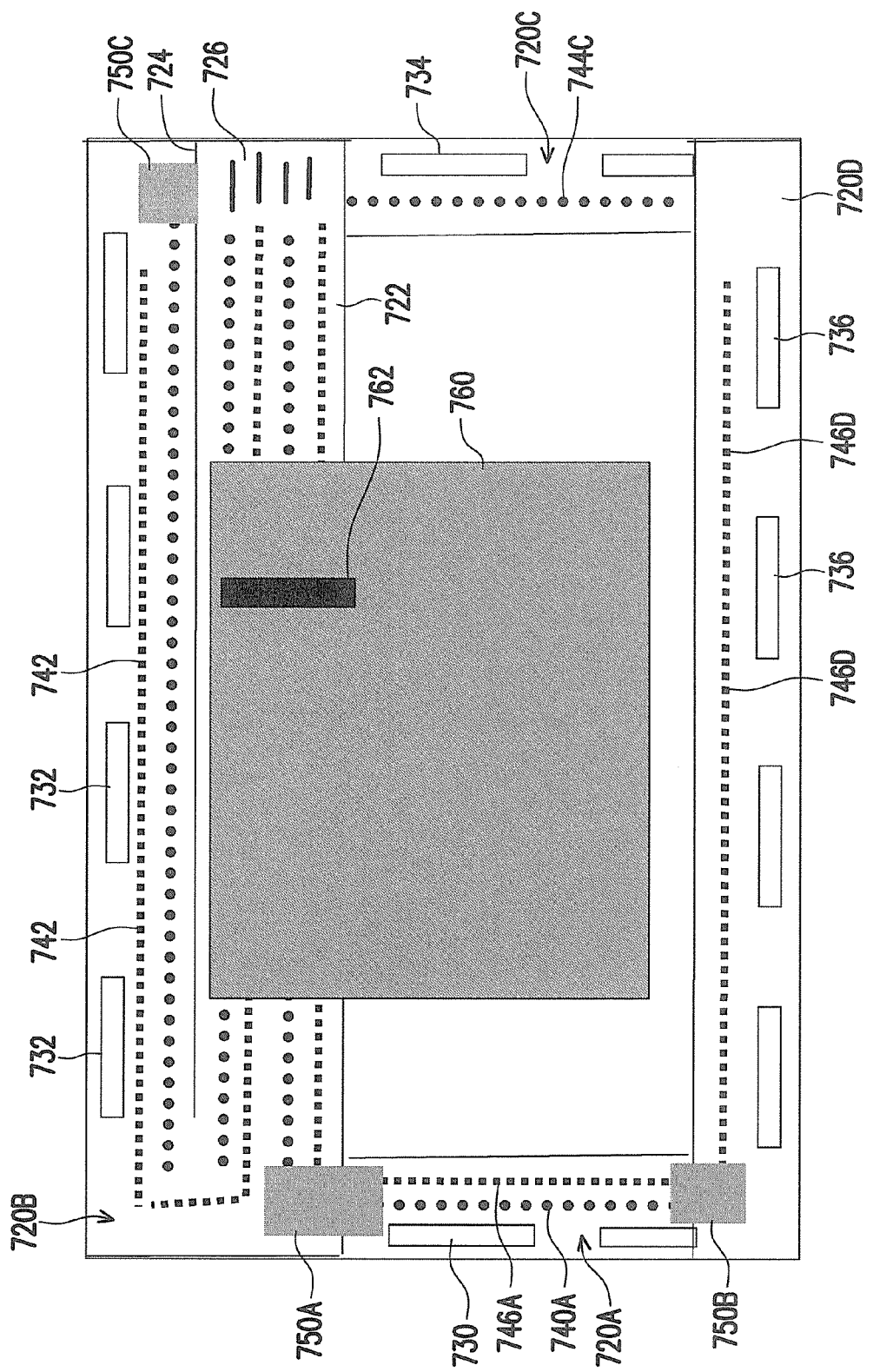

The electrical connection structure described above may be a connection pad structure, as illustrated in FIG. 7B. FIG. 7B is a diagram illustrating a connection pad structure for electrically connecting internal circuits when the first to the fourth non-display regions are folded backwards along the edges of the display region and pressed to the rear surface of the flexible substrate. As shown in FIG. 7B, the connection pads 750A, 750B, and 750C in the embodiment have the same structure as illustrated in FIG. 6B and are composed of an insulation layer, a conductive bridge, and an ACF that are stacked together. The connective lines in different non-display regions are electrically connected through the ACF. The connection terminal 726 is electrically connected to the connection port 762 of the PCB 760. Such a structure allows the driver ICs in the signal control regions 730, 732, 734, and 736 to receive controlling signals from the PCB 760 and drive the pixels in the display region 710 to display images according to these signals.

In another embodiment, the corner partition space is not disposed. Instead, the connective lines 740A and the connective lines 740B are directly connected on the flexible substrate 700, the connective lines 744B and the connective lines 744C are directly connected on the flexible substrate 700, and the connective lines 746A, the connective lines 746B, and the connective lines 746D are directly connected on the flexible substrate 700. Thus, the connection pad structure can be omitted. However, when the first-side non-display region 720A, the second-side non-display region 720B, the third-side non-display region 720C, and the fourth-side non-display region 720D are folded backwards along the edges of the display region 710 and pressed to the rear surface of the flexible substrate 700, the connective lines at the corners need to be insulation reinforced to prevent any short circuit from being produced at the folded parts.

In an exemplary embodiment, the connection terminal 726 is electrically connected to the connection port 762 of the PCB 760 in a removable manner. Namely, the flexible display panel and the external PCB are connected through a connector. In another exemplary embodiment, the flexible display panel and the external PCB may also be bonded together by using solder, conductive paste, or an ACF. The flexible display panel is connected to the PCB 760 only through the connection terminal 726.

The driver ICs in the signal control regions 730, 732, 734, and 736 may include data driver ICs, scan driver ICs or other circuits. The data driver ICs may be source driver ICs which arrange data input, offer high frequency, and drive pixels to display images. The scan driver ICs may be gate driver ICs for controlling the input of data. The driver ICs in the signal control regions 730, 732, 734, and 736 may be disposed on the flexible display panel through a SOP technique or a COP technique.

The pixel units in the display region 710 may be composed of an OLED layer, a LCD layer, a ChLCD layer, an EPD layer, an EWD layer, an ECD layer, and a QR-LPD layer or may be other display units that can be disposed on the flexible substrate.

Figure 7C:
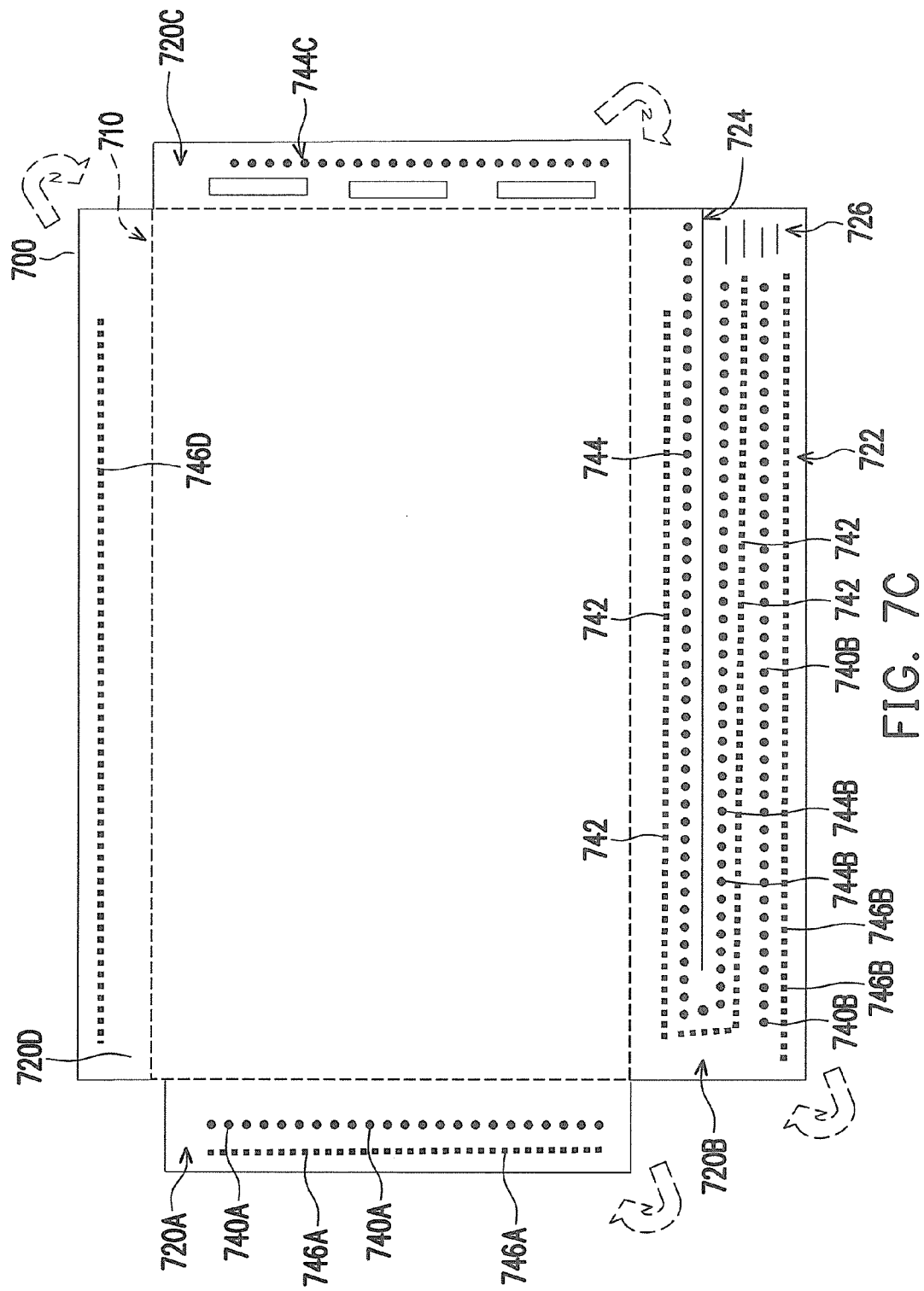
FIG. 7C is a diagram of a flexible display panel according to another exemplary embodiment of the disclosure.

FIG. 7C is a diagram of a flexible display panel according to another exemplary embodiment. This flexible display panel has a structure similar to that illustrated in FIG. 7A, wherein like elements are denoted with like reference numerals and will not be described herein. The difference between the two flexible display panels is that a portion of the signal control regions (i.e., the data driver ICs and scan driver ICs) are omitted in the flexible display panel illustrated in FIG. 7C, the pixel units in the display region 710 are partially directly connected to the connection terminal 726 respectively through the connective lines, and data signals and driving signals are directly received from the PCB, which has corresponding driver ICs disposed thereon, for driving the pixels in the display region 710 to display images.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A display module, comprising:
   a flexible display panel, wherein a plurality of pixels is disposed within the display region;
   at least one connection terminal, electrically connected to at least one external circuit board, wherein an image data processing, a timing control and power conversion circuits are disposed on the external circuit board; and
   a plurality of connective lines, wherein
   the flexible display panel, the connection terminal, and the connective lines are disposed on a same flexible substrate, the connection terminal is arranged at an extension portion of a non-display region, the connective lines are disposed within the non-display region and respectively electrically connect the display region and the connection terminal for receiving signals and transmitting the signals to the display region, the flexible display panel is electrically connected to the external circuit board through the connecton terminal, wherein the extention portion is bendable in a way that is capable of being bent back to the back of the flexible display panel, wherein the non-display region of the flexible display panel comprises at least a first-side non-display region and a second-side non-display region at two sides of the display region, and the first-side non-display region and the second-side non-display region are folded and pressed to a rear surface of the flexible substrate to constitute a display module, wherein a corner partition space is formed between the first-side non-display region and the second-side non-display region to avoid the first-side non-display region and second-side non-display region from overlapping with each other when both of the first-side non-display region and the second-side non-display region are folded back to the rear surface of the flexible substrate, such that the first-side non-display region and the second-side non-display region are conveniently folded and pressed to the rear surface of the flexible substrate.

2. The display module according to claim 1, wherein the connection terminal comprises a connector, and the connector is electrically connected to the external circuit board in a removable manner.

3. The display module according to claim 1, wherein the connection terminal is connected to the external circuit through a bonding technique by using solder, conductive paste, or an anisotropic conductive film (ACF).

4. The display module according to claim 1, wherein the display region comprises at least one or a combination of an organic light emitting diode (OLED) layer, a liquid crystal display (LCD) layer, a cholesteric liquid crystal display (ChLCD) layer, an electrophoretic display (EPD) layer, a electrowetting display (EWD) layer, an electrochromic display (ECD) layer, and a quick response liquid-powder display (QR-LPD) layer.

5. The display module according to claim 1, wherein the flexible substrate has a slit, and the extension portion is strip-shaped and is formed along a side of the non-display region, wherein one end of the extension portion is connected to a main body of the flexible display panel, and another end of the extension portion is the connection terminal.

6. The display module according to claim 1 further comprising at least one connection pad, wherein the connection pad electrically connects the connective lines within the first-side non-display region and the second-side non-display region.

7. The display module according to claim 1 further comprising at least one signal control region, wherein the signal control region is electrically disposed between the display region and the connection terminal through the connective lines.

8. The display module according to claim 7, wherein the signal control region comprises at least a driver IC, and the driver IC is disposed on the flexible substrate through a system on panel (SOP) technique or a chip on panel (COP) technique.

9. The display module according to claim 1 further comprising at least a first signal control circuit and a second signal control circuit, wherein the first signal control circuit is electrically connected to the display region and a first one of the connection terminals through the connective lines, the second signal control circuit is electrically connected to the display region and a second one of the connection terminals through the connective lines, and the first one of the connection terminals and the second one of the connection terminals are respectively electrically connected to different circuit regions of the external circuit.

10. The display module according to claim 9, wherein the first one of the connection terminals and the second one of the connection terminals respectively have a first connector and a second connector, and the first connector and the second connector are electrically connected to the external circuit in a removable manner.

11. The display module according to claim 9, wherein the first one of the connection terminals and the second one of the connection terminals are respectively connected to the external circuit through a bonding technique by using solder, conductive paste, or ACF.

12. The display module according to claim 9, wherein the first one of the connection terminals or the second one of the connection terminals is electrically connected to the external circuit either in a removable manner or through a bonding technique.

13. An assembly method of a display module, comprising:
providing a flexible display panel, wherein the flexible display panel has a display region, a connection terminal, and a plurality of connective lines, the display region, the connection terminal, and the connective lines are disposed on a first surface of a same flexible substrate, the flexible substrate comprises a first-side non-display region and a second-side non-display region, the first-side non-display region and the second-side non-display region are arranged at two adjacent sides of the display region, the connective lines are respectively disposed within the first-side non-display region and the second-side non-display region and comprise a first-side connective line and a second-side connective line for respectively connecting pixels within the display region, and the connection terminal is connected to an external circuit, wherein an image data processing, a timing control and power conversion circuits are disposed on the external circuit, wherein a corner partition space is formed between the first-side non-display region and the second-side non-display region to avoid the first-side non-display region and second-side non-display region from overlapping with each other when both of the first-side non-display region and the second-side non-display region are folded back to the rear surface of the flexible substrate, such that the first-side non-display region and the second-side non-display region are conveniently folded and pressed to a rear surface of the flexible substrate;
forming an extension portion at the first-side non-display region, wherein the extention portion is bendable in a way that is capable of being bent back to the back of the flexible display panel, one end of the extension portion is connected to a main body of the flexible display panel, another end of the extension portion is the connection terminal, and the flexible display panel is electrically connected to the external circuit through the connection terminal; and
folding and pressing the first-side non-display region and the second-side non-display region to a second surface of the flexible substrate along two edges of the display region, wherein the second surface is a wrong side of the first surface.

14. The assembly method according to claim 13, wherein after the step of folding and pressing the first-side non-display region and the second-side non-display region to the second surface of the flexible substrate, the assembly method further comprises electrically connecting the connective lines within the first-side non-display region and the second-side non-display region by using a connection pad.

15. The assembly method according to claim 14, wherein the connection pad is connected by using ACF, solder, or conductive paste.

\* \* \* \* \*